US012160253B2

(12) United States Patent
Xie

(10) Patent No.: US 12,160,253 B2
(45) Date of Patent: Dec. 3, 2024

(54) SYSTEMS AND METHODS FOR DATA PROCESSING

(71) Applicant: UNITED IMAGING RESEARCH INSTITUTE OF INNOVATIVE MEDICAL EQUIPMENT, Guangdong (CN)

(72) Inventor: Fan Xie, Shenzhen (CN)

(73) Assignee: UNITED IMAGING RESEARCH INSTITUTE OF INNOVATIVE MEDICAL EQUIPMENT, Shenzhen (CN)

( * ) Notice: Subject to any disclaimer, the term of this patent is extended or adjusted under 35 U.S.C. 154(b) by 91 days.

(21) Appl. No.: 17/819,306

(22) Filed: Aug. 11, 2022

(65) Prior Publication Data

US 2023/0062067 A1  Mar. 2, 2023

(30) Foreign Application Priority Data

Aug. 11, 2021 (CN) .......................... 202110918085.1

(51) Int. Cl.
*H03M 7/30* (2006.01)
*H03M 7/40* (2006.01)

(52) U.S. Cl.
CPC ........... *H03M 7/6011* (2013.01); *H03M 7/30* (2013.01); *H03M 7/3073* (2013.01);
(Continued)

(58) Field of Classification Search
CPC ............ H03M 7/6011; H03M 7/4068; H03M 7/4093; H03M 7/3073; H03M 7/6064; H03M 7/30
(Continued)

(56) References Cited

U.S. PATENT DOCUMENTS 6,195,024 B1 * 2/2001 Fallon ....................... G06T 9/00
341/51
2010/0259631 A1  10/2010 Sugita
(Continued)

FOREIGN PATENT DOCUMENTS

CN    107979378 A    5/2018
CN    110198171 A    9/2019
(Continued)

OTHER PUBLICATIONS

"FLAC-Format", Web page <https://xiph.org/flac/format.html>, 2011.
(Continued)

*Primary Examiner* — Khai M Nguyen
(74) *Attorney, Agent, or Firm* — METIS IP LLC

(57) ABSTRACT

The present disclosure provides a data processing system and method. The method may include obtaining preliminary data. The method may also include generating first encoded data by compressing the preliminary data in a first encoding procedure. The method may further include determining whether a compression ratio of the first encoded data is below a compression threshold. The method may still further include generating second encoded data by compressing the preliminary data in a second encoding procedure in response to determining that the compression ratio of the first encoded data is below the compression threshold, wherein the first encoding procedure and the second encoding procedure are lossless compressions.

20 Claims, 10 Drawing Sheets

(52) U.S. Cl.
CPC ....... *H03M 7/4068* (2013.01); *H03M 7/4093* (2013.01); *H03M 7/6064* (2013.01)

(58) Field of Classification Search
USPC ...................................................... 341/50–51
See application file for complete search history.

(56) References Cited

U.S. PATENT DOCUMENTS

| | | | |
|---|---|---|---|
| 2014/0207745 A1* | 7/2014 | Groseclose | G06F 3/0638 |
| | | | 707/693 |
| 2022/0182072 A1 | 6/2022 | Wang et al. | |

FOREIGN PATENT DOCUMENTS

| | | |
|---|---|---|
| CN | 110266316 A | 9/2019 |
| CN | 112101548 A | 12/2020 |
| CN | 112953550 A | 6/2021 |

OTHER PUBLICATIONS

"Monkey's Audio", Web page <https://monkeysaudio.com/theory.html>, 2000.

Shang, Jin et al., A Test Data Compression Scheme Based on Mixed Compatible Data Blocks, Journal of Harbin University of Science and Technology, 16(6): 93-96, 2011.

\* cited by examiner

1100

Obtaining an encoded data stream and metadata from the encoded data stream ~ 1110

Determining preliminary data corresponding to the encoded data stream based on the metadata ~ 1120

FIG. 11

SYSTEMS AND METHODS FOR DATA PROCESSING

CROSS-REFERENCE TO RELATED APPLICATIONS

This application claims priority to Chinese Patent Application No. 202110918085.1 filed on Aug. 11, 2021, the entire contents of which are hereby incorporated by reference.

TECHNICAL FIELD

This disclosure generally relates to data processing, and more particularly, relates to systems and methods for data compression and decompression.

BACKGROUND

In the present information age, the volume of data or information available to people worldwide has increased exponentially over the past few years. Vast amount of data is being generated, processed, and transmitted incessantly, making data compression more and more important. In particular, lossless compression of large volume of data is often needed for the maintenance of high data fidelity and such lossless compression is preferably executed before transmission especially in cases of limited bandwidths. However, conventional lossless compression strategies can seldom reach a satisfiable compression ratio. Thus, there is a need for systems and methods of lossless compressions that are more effective and/or reliable.

SUMMARY

According to an aspect of the present disclosure, a system is provided. The system may include at least one storage medium including a set of instructions; and at least one processor configured to communicate with the at least one storage medium, wherein when executing the set of instructions. The at least one processor is configured to direct the system to perform operations including obtaining preliminary data; generating first encoded data by compressing the preliminary data in a first encoding procedure; determining whether a compression ratio of the first encoded data is below a compression threshold; and in response to determining that the compression ratio of the first encoded data is below the compression threshold, generating second encoded data by compressing the preliminary data in a second encoding procedure, wherein the first encoding procedure and the second encoding procedure are lossless compressions.

According to another aspect of the present disclosure, a method implemented on a computing device having a processor and a computer-readable storage device is provided. The method may include obtaining preliminary data; generating first encoded data by compressing the preliminary data in a first encoding procedure; determining whether a compression ratio of the first encoded data is below a compression threshold; and in response to determining that the compression ratio of the first encoded data is below the compression threshold, generating second encoded data by compressing the preliminary data in a second encoding procedure, wherein the first encoding procedure and the second encoding procedure are lossless compressions.

According to a further aspect of the present disclosure, a non-transitory readable medium including at least one set of instructions is provided. When executed by at least one processor of a computing device, the at least one set of instructions may direct the at least one processor to perform a method. The method may include obtaining preliminary data; generating first encoded data by compressing the preliminary data in a first encoding procedure; determining whether a compression ratio of the first encoded data is below a compression threshold; and in response to determining that the compression ratio of the first encoded data is below the compression threshold, generating second encoded data by compressing the preliminary data in a second encoding procedure, wherein the first encoding procedure and the second encoding procedure are lossless compressions.

In some embodiments, obtaining the preliminary data includes obtaining a data stream; dividing the data stream into a plurality of data blocks; for each of the plurality of data blocks, identifying a first former data point prior to a current data point and a second former data point prior to the first former data point, the data block including a sequence of n data points, the current data point being a data point selected from the third data point to the n-th data point; determining a predicted data point corresponding to the current data point based on the first former data point and the second former data point; and determining a difference value corresponding to the current data point based on the predicted data point and the current data point; generating, according all the difference values, a difference sequence of the plurality of data blocks by traversing all the data points of the data blocks; and including the difference sequence in the preliminary data.

In some embodiments, generating the first encoded data by compressing the preliminary data in the first encoding procedure includes determining a shortest coding parameter corresponding to the preliminary data; and generating the first encode data based on the shortest coding parameter.

In some embodiments, generating the second encoded data by compressing the preliminary data in the second encoding procedure includes determining an encoding length of the preliminary data based on a value of the preliminary data; generating intermediate encoded data by compressing the preliminary data based on the encoding length; and generating the second encoded data based on the intermediate encoded data and the encoding length.

In some embodiments, generating the intermediate encoded data by compressing the preliminary data based on the encoding length includes generating the intermediate encoded data by moving bytes of the preliminary data leftwards according to the encoding length.

In some embodiments, generating the intermediate encoded data by compressing the preliminary data based on the encoding length includes identifying one or more invalid bytes in the preliminary data based on the encoding length; and generating the intermediate encoded data by removing the one or more invalid bytes from the preliminary data.

In some embodiments, generating the second encoded data based on the intermediate encoded data and the encoding length includes generating length encoded data by encoding the encoding length; and generating the second encoded data by inserting the length encoded data into one or more bit positions within the intermediate encoded data.

In some embodiments, generating the second encoded data based on the intermediate encoded data and the encoding length includes generating length encoded data by encoding the encoding length; and generating the second encoded data by splicing the length encoded data and the intermediate encoded data.

In some embodiments, the operations further includes generating target data based on the second encoded data and metadata associating with the second encoded data.

In some embodiments, the operations further includes transmitting the second encoded data in a limited bandwidth.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 11 is a flowchart illustrating an exemplary process for data decompression according to some embodiments of the present disclosure.

DETAILED DESCRIPTION

Figure 1:
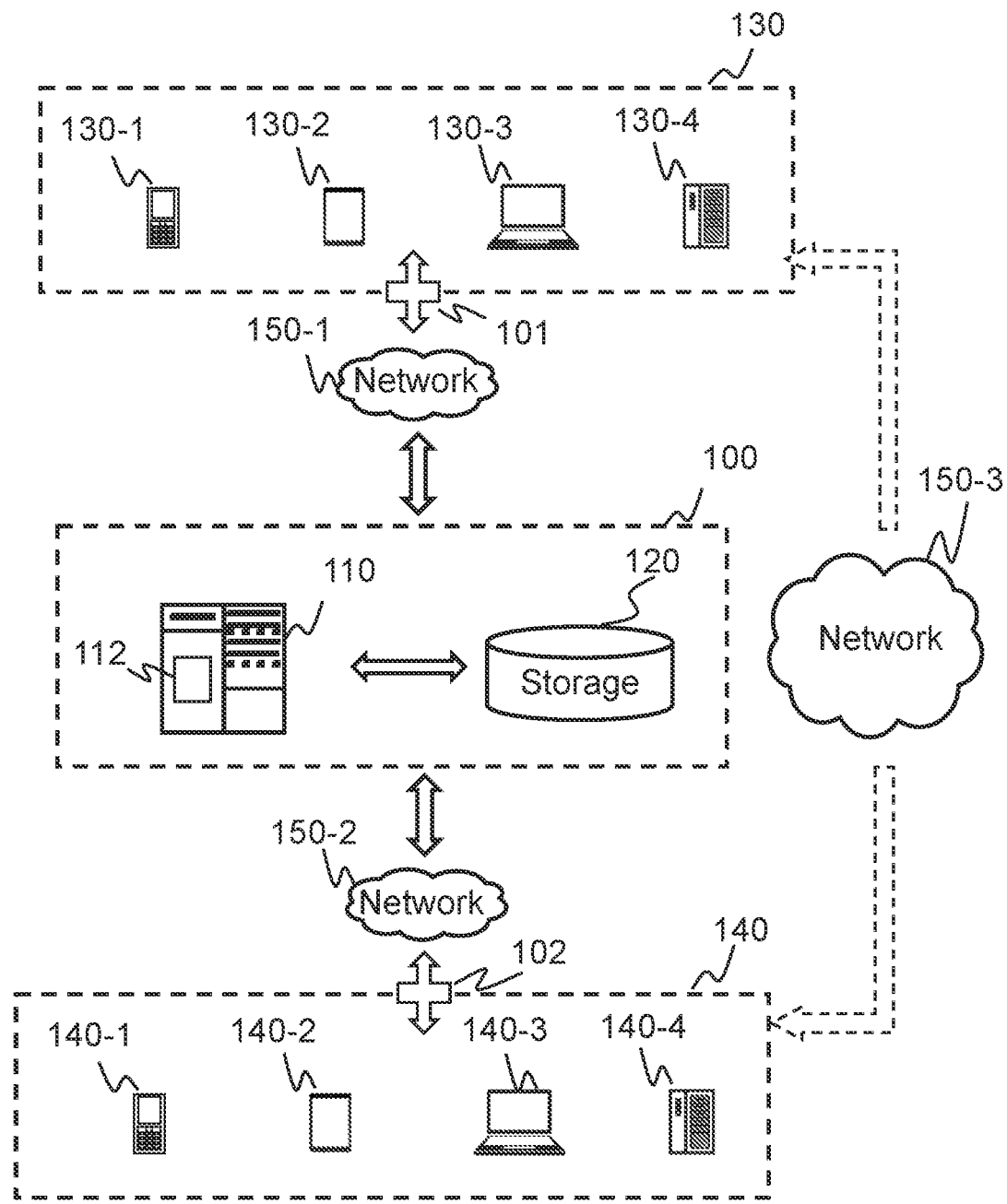
FIG. 1 is a schematic diagram illustrating an exemplary data processing system according to some embodiments of the present disclosure.

In order to illustrate the technical solutions related to the embodiments of the present disclosure, brief introduction of the drawings referred to in the description of the embodiments is provided below. Obviously, drawings described below are only some examples or embodiments of the present disclosure. Those having ordinary skills in the art, without further creative efforts, may apply the present disclosure to other similar scenarios according to these drawings. Unless stated otherwise or obvious from the context, the same reference numeral in the drawings refers to the same structure and operation.

As used in the disclosure and the appended claims, the singular forms "a," "an," and "the" include plural referents unless the content clearly dictates otherwise. It will be further understood that the terms "comprises," "comprising," "includes," and/or "including" when used in the disclosure, specify the presence of stated steps and elements, but do not preclude the presence or addition of one or more other steps and elements.

Some modules of the system may be referred to in various ways according to some embodiments of the present disclosure, however, any number of different modules may be used and operated in a client terminal and/or a server. These modules are intended to be illustrative, not intended to limit the scope of the present disclosure. Different modules may be used in different aspects of the system and method.

According to some embodiments of the present disclosure, flow charts are used to illustrate the operations performed by the system. It is to be expressly understood, the operations above or below may or may not be implemented in order. Conversely, the operations may be performed in inverted order, or simultaneously. Besides, one or more other operations may be added to the flowcharts, or one or more operations may be omitted from the flowchart.

Technical solutions of the embodiments of the present disclosure be described with reference to the drawings as described below. It is obvious that the described embodiments are not exhaustive and are not limiting. Other embodiments obtained, based on the embodiments set forth in the present disclosure, by those with ordinary skill in the art without any creative works are within the scope of the present disclosure.

In an aspect, the present disclosure is directed to systems and methods for data compression. The system may obtain preliminary data which include a difference sequence. The preliminary data may be compressed in a first encoding procedure and/or the second encoding procedure. The first encoding procedure may relate to a shortest coding parameter corresponding to the preliminary data. The effectivity and efficiency of the first encoding procedure may depend on the continuity of the preliminary data. If the compression ratio of first encoded data generated in the first encoding procedure is below the threshold, it may indicate that the degree of compression of the first encoded data is not satisfying. The preliminary data may be re-compressed in a lossless manner in the second encoding procedure. The second encoding procedure may relate to an encoding length of the preliminary data. The second encoding procedure may be less sensitive to the continuity of the preliminary data. In this case, the second encoding procedure may serve as a complimentary for the first encoding procedure. By compressing the preliminary data in the first encoding procedure and/or the second encoding procedure, a volume of the preliminary data may be reduced effectively without losing data fidelity.

FIG. 1 is a schematic diagram illustrating an exemplary data processing system according to some embodiments of the present disclosure. The data processing system 100 may be a platform for data processing and/or transmission, for example, compressing and/or decompressing data including, e.g., medical data, networking data, communication data, manufacturing data, etc. The data processing system 100 may include a data exchange port 101, a data transmitting port 102, a processing device 110, and a storage device 120. In some embodiments, the data processing system 100 may interact with a data providing system 130 and a data allocating system 140 via the data exchange port 101 and the data transmitting port 102, respectively. For example, data processing system 100 may access information and/or data stored in the data providing system 130 via the data exchange port 101. As another example, the processing device 110 may send processed information and/or data to the data allocating system 140 via the data transmitting port 102.

The processing device 110 may process information and/or data. For example, the processing device 110 may receive data (e.g., a data stream), and compress/decompress the received data. In some embodiments, the processing device 110 may be a single server, or a server group. The server group may be centralized, or distributed (e.g., the processing device 110 may be a distributed system). In some embodiments, the processing device 110 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 110 may be implemented on a computing device having one or more components illustrated in FIG. 2 in the present disclosure.

Merely by way of example, the processing device 110 may include a central processing unit (CPU), an application-specific integrated circuit (ASIC), an application-specific instruction-set processor (ASIP), a graphics processing unit (GPU), a physics processing unit (PPU), a digital signal processor (DSP), a field programmable gate array (FPGA), a programmable logic device (PLD), a controller, a microcontroller unit, a reduced instruction-set computer (RISC), a microprocessor, or the like, or any combination thereof.

The storage device 120 may store data and/or instructions related to data compressing and/or data decompression. In some embodiments, the storage device 120 may store data obtained/acquired from the data providing system 130 and/or the data allocating system 140. In some embodiments, the storage device 120 may store data and/or instructions that the processing device 110 may execute or use to perform exemplary methods described in the present disclosure. In some embodiments, the storage device 120 may include a mass storage, a removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 120 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 120 may be connected to or communicate with the processing device 110. The processing device 110 may access data or instructions stored in the storage device 120 directly or via a network. In some embodiments, the storage device 120 may be a part of the processing device 110.

The data providing system 130 may provide data and/or information. The data and/or information may include text, images, files, video recordings, user requests, programs, applications, algorithms, instructions, computer codes, or the like, or a combination thereof. In some embodiments, the data providing system 130 may provide the data and/or information to the processing device 110 and/or the storage device 120 of the data processing system 100 for processing (e.g., compressing or decompressing). In some embodiments, the data providing system 130 may provide the data and/or information to the data allocating system 140 for transmitting compressed data or decompressed data to a user.

In some embodiments, the data allocating system 140 may facilitate data transmission. The data allocating system 140 may generate responses to requests for, for example, data compression or decompression over a network.

In some embodiments, the data providing system 130 and/or the data allocating system 140 may be a device, a platform, or other entity interacting with the data processing system 100. In some embodiments, the data providing system 130 may be implemented in a device with data acquisition and/or data storage, such as a mobile device 130-1, a tablet computer 130-2, a laptop computer 130-3, and a server 130-4, a storage device (not shown), or the like, or any combination thereof. In some embodiments, the data allocating system 140 may also be implemented in a device with data processing, such as a mobile device 140-1, a tablet computer 140-2, a laptop computer 140-3, and a server 140-4, or the like, or any combination thereof. In some embodiments, the mobile devices 130-1 and 140-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, a smart footgear, a smart glass, a smart helmet, a smart watch, a smart clothing, a smart backpack, a smart accessory, or the like, or any combination thereof. In some embodiments, the smart mobile device may include a smartphone, a personal digital assistance (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google Glass, an Oculus Rift, a HoloLens, a Gear VR, etc. In some embodiments, the servers 130-4 and 140-4 may include a database server, a file server, a mail server, a web server, an application server, a computing server, a media server, a communication server, etc.

In some embodiments, any two systems of the data processing system 100, the data providing system 130, and the data allocating system 140 may be integrated into a device or a platform. For example, both the data providing system 130 and the data allocating system 140 may be implemented in a mobile device of a user. In some embodiments, the data processing system 100, the data providing system 130, and the data allocating system 140 may be integrated into a device or a platform. For example, the data processing system 100, the data providing system 130, and the data allocating system 140 may be implemented in a computing device including a server and a user interface.

Networks 150-1 through 150-3 may facilitate exchange of information and/or data. In some embodiments, one or more components in the data processing system 100 (e.g., the processing device 110 and/or the storage device 130) may send and/or receive information and/or data to/from the data providing system 130 and/or the data allocating system 140 via the networks 150-1 through 150-3. In some embodiments, the networks 150-1 through 150-3 may be any type of wired or wireless networks, or combination thereof. Merely by way of example, the networks 150 may include a cable network, a wireline network, an optical fiber network, a tele communications network, an intranet, an Internet, a local area network (LAN), a wide area network (WAN), a wireless local area network (WLAN), a metropolitan area network (MAN), a wide area network (WAN), a public telephone switched network (PSTN), a Bluetooth™ network, a ZigBee™ network, a near field communication (NFC) network, a global system for mobile communications (GSM) network, a code-division multiple access (CDMA) network, a time-division multiple access (TDMA) network, a general packet radio service (GPRS) network, an enhanced data rate for GSM evolution (EDGE) network, a wideband code division multiple access (WCDMA) network, a high speed downlink packet access (HSDPA) network, a long term evolution (LTE) network, a user datagram protocol (UDP) network, a transmission control protocol/Internet protocol (TCP/IP) network, a short message service (SMS) network, a wireless application protocol (WAP) network, an ultra wide band (UWB) network, an infrared ray, or the like, or any combination thereof.

Figure 2:
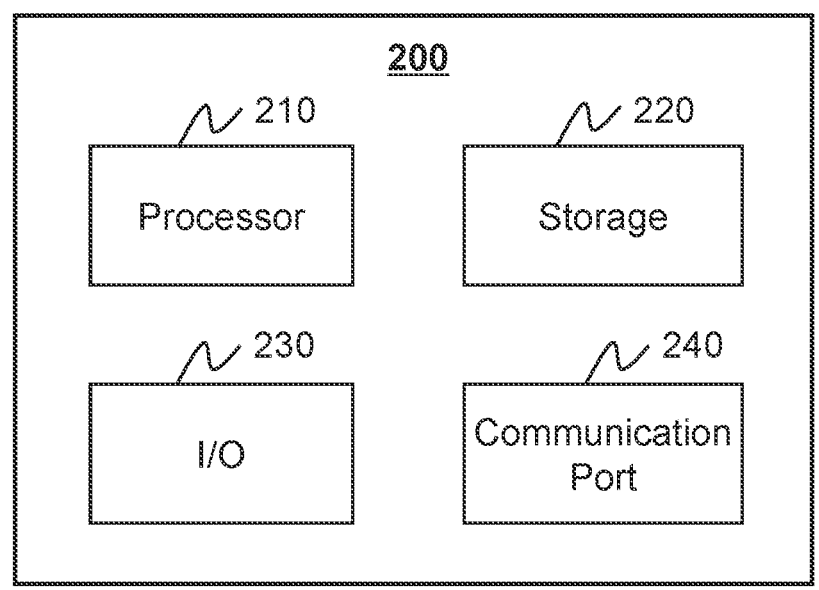
FIG. 2 is a schematic diagram illustrating exemplary components of a computing device according to some embodiments of the present disclosure.

FIG. 2 is a schematic diagram illustrating exemplary hardware and/or software components of a computing device 200 according to some embodiments of the present disclosure. The computing device 200 may be used to implement any component of the data processing system 100 as described herein. For example, the processing device 110 may be implemented on the computing device 200, respectively, via its hardware, software program, firmware, or a combination thereof. Although only one such computing device is shown, for convenience, the computer functions relating to the data processing system 100 as described herein may be implemented in a distributed fashion on a number of similar platforms, to distribute the processing load. As illustrated in FIG. 2, the computing device 200 may include a processor 210, a storage 220, an input/output (I/O) 230, and a communication port 240.

The processor 210 may execute computer instructions (e.g., program code) and perform functions of the processing device 110 in accordance with techniques described herein. The computer instructions may include, for example, routines, programs, objects, components, data structures, procedures, modules, and functions, which perform particular functions described herein. For example, the processor 210 may process data or information obtained from the storage device 120, the data providing system 130, and/or the data allocating system 140. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors, thus operations and/or method operations that are performed by one processor as described in the present disclosure may also be jointly or separately performed by the multiple processors. For example, if in the present disclosure the processor of the computing device 200 executes both operation A and operation B, it should be understood that operation A and operation B may also be performed by two or more different processors jointly or separately in the computing device 200 (e.g., a first processor executes operation A and a second processor executes operation B, or the first and second processors jointly execute operations A and B).

The storage 220 may store data/information obtained from the processing device 110, the storage device 120, the data providing system 130, and/or the data allocating system 140. In some embodiments, the storage 220 may include a mass storage device, a removable storage device, a volatile read-and-write memory, a read-only memory (ROM), or the like, or any combination thereof. In some embodiments, the storage 220 may store one or more programs and/or instructions to perform exemplary methods described in the present disclosure. For example, the storage 220 may store a program for the processing device 110 to execute for data compression and/or decompression.

The I/O 230 may input and/or output signals, data, information, etc. In some embodiments, the I/O 230 may enable a user interaction with the processing device 120. In some embodiments, the I/O 230 may include an input device and an output device. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to another component (e.g., the processing device 120) via, for example, a bus, for further processing. Other types of the input device may include a cursor control device, such as a mouse, a trackball, or cursor direction keys, etc. The output device may include a display (e.g., a liquid crystal display (LCD), a light-emitting diode (LED)-based display, a flat panel display, a curved screen, a television device, a cathode ray tube (CRT), a touch screen), a speaker, a printer, or the like, or a combination thereof.

The communication port 240 may be connected to a network (e.g., the network 150) to facilitate data communications. The communication port 240 may establish connections between the processing device 110 and the storage device 120, the data providing system 130, and/or the data allocating system 140. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMax™ link, a WLAN link, a ZigBee™ link, a mobile network link (e.g., 3G, 4G, 5G), or the like, or a combination thereof. In some embodiments, the communication port 240 may be and/or include a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
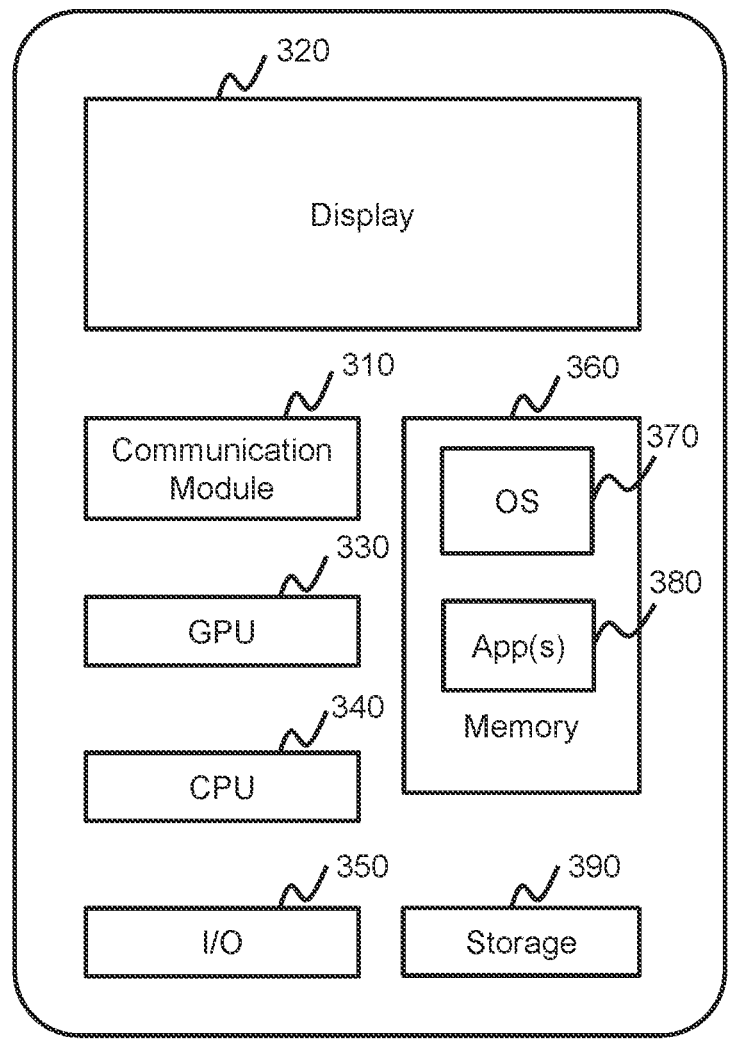
FIG. 3 is a schematic diagram illustrating exemplary hardware and/or software components of an exemplary user terminal according to some embodiments of the present disclosure.

FIG. 3 is a block diagram illustrating exemplary hardware and/or software components of an exemplary mobile device according to some embodiments of the present disclosure. The data providing system 130 or the data allocating system 140 may be implemented on the mobile device 300 according to some embodiments of the present disclosure. As illustrated in FIG. 3, the mobile device 300 may include a communication module 310, a display 320, a graphic processing unit (GPU) 330, a central processing unit (CPU) 340, an I/O 350, a memory 360, and a storage 390. The CPU 340 may include interface circuits and processing circuits similar to the processor 220. In some embodiments, any other suitable component, including but not limited to a system bus or a controller (not shown), may also be included in the mobile device 300. In some embodiments, a mobile operating system 370 (e.g., iOS™, Android™, Windows Phone™, etc.) and one or more applications 380 may be loaded into the memory 360 from the storage 390 in order to be executed by the CPU 340. The applications 380 may include a browser or any other suitable mobile apps for receiving and rendering information relating to data compression and/or decompression on the mobile device 300. User interactions with the information stream may be achieved via the I/O devices 350 and provided to the processing device 110 and/or other components of the data processing system 100 via the networks 150-1 through 150-3.

In order to implement various modules, units and their functions described above, a computer hardware platform may be used as hardware platforms of one or more elements (e.g., a component of the sever 110 described in FIG. 1). Since these hardware elements, operating systems, and program languages are common, it may be assumed that persons skilled in the art may be familiar with these techniques and they may be able to provide information required in the data processing according to the techniques described in the present disclosure. A computer with user interface may be used as a personal computer (PC), or other types of workstations or terminal devices. After being properly programmed, a computer with user interface may be used as a server. It may be considered that those skilled in the art may also be familiar with such structures, programs, or general operations of this type of computer device. Thus, extra explanations are not described for the figures.

Figure 4:
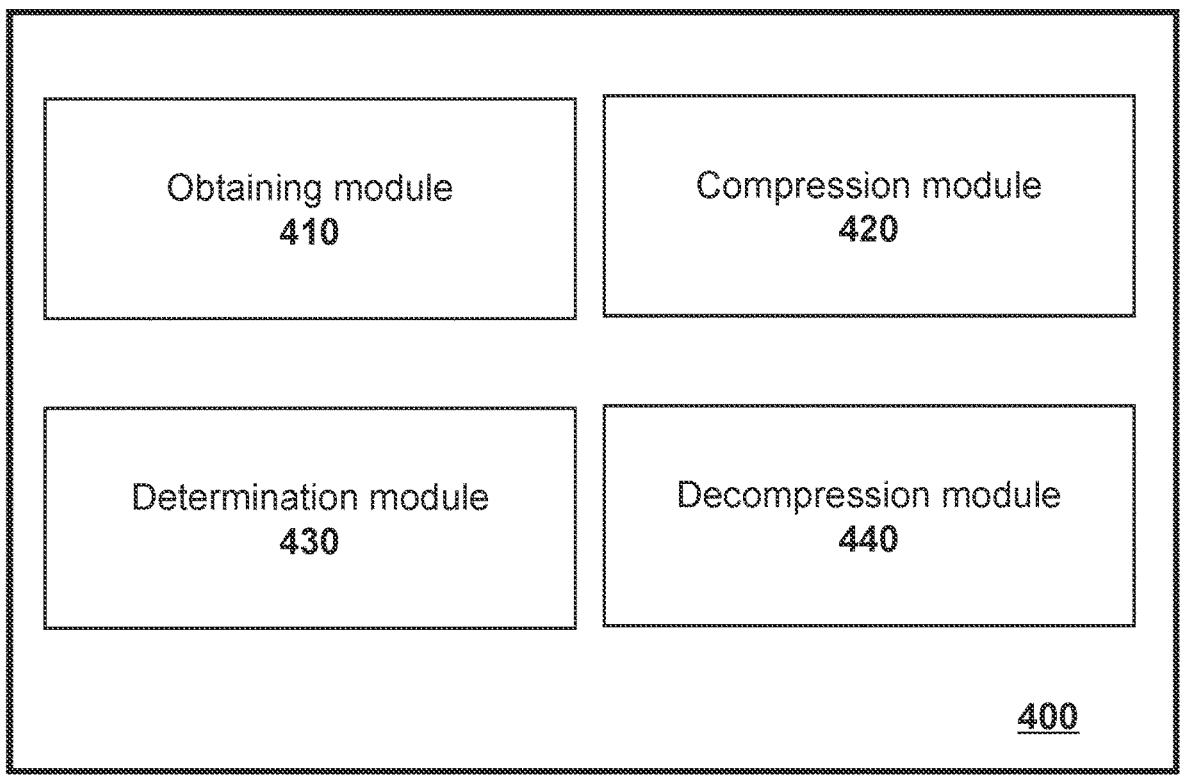
FIG. 4 is a block diagram illustrating an exemplary processing device according to some embodiments of the present disclosure.

FIG. 4 is a block diagram illustrating an exemplary processing device according to some embodiments of the present disclosure.

In some embodiments, the processing device 110 may include an obtaining module 410, a compression module 420, a determination module 430, and a decompression module 440. One or more of the modules of the processing device 110 may be interconnected. The connection(s) may be wireless or wired. At least a portion of the processing device 110 may be implemented on a computing device as illustrated in FIG. 2 or a mobile device as illustrated in FIG. 3.

The obtaining module 410 may obtain data and/or information. In some embodiments, the obtaining module 410 may obtain preliminary data. The preliminary data may be, for example, data to be compressed. In some embodiments, the obtaining module 410 may obtain preliminary data from a storage device (e.g., the storage device 120, the data providing system 130) directly. In some embodiments, the obtaining module 410 may obtain original data in the form of a data stream. The preliminary data may be obtained by intercepting and processing one or more portions (e.g., data blocks) of the data stream.

The compression module 420 may compress the preliminary data. In some embodiments, the compression module 420 may compress the preliminary data in a first encoding procedure or a second encoding procedure. The first encoding procedure and the second encoding procedure may be lossless compression procedures. In some embodiments, the first encoding procedure may relate to a shortest coding parameter corresponding to the preliminary data. The second encoding procedure may relate to an encoding length of the preliminary data.

The determination module 430 may determine whether a compression ratio of the first encoded data or the second encoded data is below a compression threshold. The compression ratio may be a ratio of a data volume of uncompressed data (e.g., the preliminary data) to a data volume of compressed data (e.g., the first encoded data). The determination module 430 may determine the compression ratio of the first encoded data based on a volume of the preliminary data and a volume of the first encoded data.

The decompression module 440 may decompress an encoded data stream. In some embodiments, the decompression module 440 may obtain metadata from the encoded data stream. The metadata may include, for example, the compression mode, the load length, and the load data regarding the target data (e.g., the first target data or the second target data). The decompression module 440 may determine preliminary data corresponding to the encoded data stream based on the metadata.

It should be noted that the above descriptions of the processing device 120 are provided for the purposes of illustration, and not intended to limit the scope of the present disclosure. For persons having ordinary skills in the art, various modifications and changes in the forms and details of the application of the above method and system may occur without departing from the principles of the present disclosure. In some embodiments, the processing device 110 may include one or more other modules. In some embodiments, two or more modules in the processing device 110 may form one module. However, those variations and modifications also fall within the scope of the present disclosure.

Figure 5:
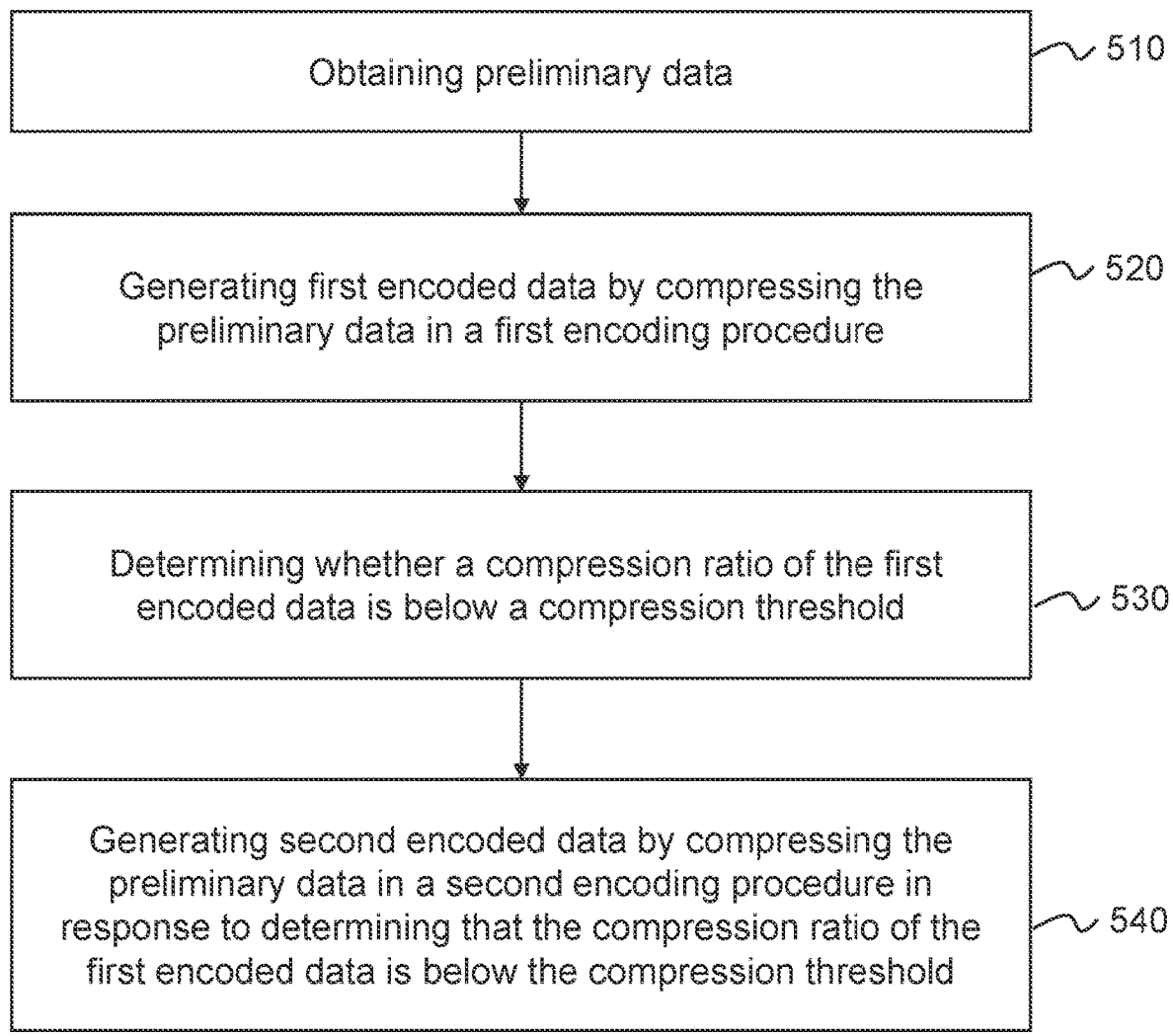
FIG. 5 is a flowchart illustrating an exemplary process for data compression according to some embodiments of the present disclosure.

FIG. 5 is a flowchart illustrating an exemplary process for data compression according to some embodiments of the present disclosure. In some embodiments, the process 500 may be implemented in the data processing system 100. For example, the process 500 may be stored in the storage 120 and/or the storage (e.g., a ROM, a RAM, etc.) as a form of instructions, and invoked and/or executed by the processing device 110 (e.g., the processor 210).

In 510, the processing device 110 (e.g., the obtaining module 410, the processor 210) may obtain preliminary data.

The preliminary data may be, for example, data to be compressed. In some embodiments, the preliminary data may be obtained from a storage device (e.g., the storage device 120, the data providing system 130) directly. In some embodiments, original data in the form of a data stream may be obtained. The preliminary data may be obtained by intercepting and processing one or more portions (e.g., data blocks) of the data stream. A data volume of each of the one or more data blocks may be the same or different. In some embodiments, the data volume of each of the one or more data blocks may be determined according to requirements for real-time performance and a data sampling rate. For example, a data stream with a data sampling rate of 1000 Hertz (Hz) is divided, at a time interval of 0.1 seconds, into a plurality of data blocks. Each of the plurality of data blocks may include 100 data points.

Merely for illustration, original data in the form of a data stream may be obtained. The processing device 110 may divide the data stream into a plurality of data blocks. Each of the plurality of data blocks may include a sequence of data points. As for a current data point in the data block, the processing device 110 may identify a first former data point prior to the current data point and a second former data point prior to the first former data point. Illustratively, the sequence of data points may include a data points, i.e., the number of data points in the sequence of the data points is a. The current data point may be a data point selected from the third data point to the a-th data point (i.e., the final data point) in the sequence of data points. The first former data point refers to a data point immediately before of the current data point. The second former data point refers to a data point immediately before of the first former data point. For example, if the current data point is the third data point in the sequence of data points, the first former data point and the second former data point may be the second data point and the first data point in the sequence of data points, respectively.

In some embodiments, the processing device 110 may determine a predicted data point corresponding to the current data point based on the first former data point and the second former data point. The determination of the predicted data point may be implemented according to a linear prediction, a nonlinear prediction, etc. Exemplary linear prediction algorithms may include a simple average algorithm, an arithmetic mean algorithm, a moving average algorithm, etc. Exemplary nonlinear prediction algorithms may include a polynomial prediction algorithm, a Gaussian distribution prediction algorithm, an exponential distribution prediction algorithm, etc. In some embodiments, the prediction algorithm used to determine the predicted data point may be selected according to a type of the current data point. For example, as for electroencephalography (EEG) data, a linear prediction algorithm may be used.

Then a difference value corresponding to the current data point may be determined based on the predicted data point and the current data point. For example, the difference value may be a difference between a value of the predicted data point and a value of the current data point. In some embodiments, the current data point may traverse the data points from the third data point to the a-th data point in the data block, and difference values corresponding to the current data point may be determined. The determined difference values may constitute a difference sub-sequence of the data block. The difference sub-sequence may include (a−2) difference values (i.e., the number of difference values may be (a−2)), each of which corresponds to a data point from the third data point to the a-th data point in the data block. Further, the processing device 110 may generate, according to all the difference values corresponding to the current data point, a difference sequence of the plurality of data blocks by traversing all the data points in the plurality of data blocks.

The difference sequence of the plurality of data blocks may be constituted by the difference sub-sequence of each of the plurality of data blocks.

The preliminary data may include the difference sequence. In some embodiments, the preliminary data may further include the first data point and the second data point of each of the plurality of data blocks.

Alternatively, the data stream may not be divided into the plurality of data blocks. The data stream may include b data points, i.e., the number of data points in the data stream is b. The processing device 110 may traverse all the data points from the third data point to the b-th data point in the data stream, and generate a difference sequence of the data stream. The difference sequence may include (b−2) difference values (i.e., the number of difference values may be (b−2)), each of which corresponds to a data point from the third data point to the b-th data point in the data stream. The preliminary data may include the difference sequence. In some embodiments, the preliminary data may further include the first data point and the second data point of the data stream.

In 520, the processing device 110 (e.g., the compression module 420, the processor 210) may generate first encoded data by compressing the preliminary data in a first encoding procedure.

The first encoding procedure may be a lossless compression procedure. In some embodiments, the first encoding procedure may relate to a shortest coding parameter corresponding to the preliminary data. Merely by way of example, in the first encoding procedure, a shortest coding parameter corresponding to the preliminary data may be determined. The first encode data may be generated based on the shortest coding parameter. The shortest coding parameter may be a parameter indicating a minimum number (or count) of bits for storing the preliminary data. Details regarding the generation of the first encoded data may be found elsewhere in the present disclosure, for example, FIG. 7 and the descriptions thereof.

In 530, the processing device 110 (e.g., the determination module 430, the processor 210) may determine whether a compression ratio of the first encoded data is below a compression threshold.

As used herein, the compression ratio refers to a ratio of a data volume of uncompressed data (e.g., the preliminary data) to a data volume of compressed data (e.g., the first encoded data). The greater the compression ratio is, the high a degree of compression may be. The processing device 110 may determine the compression ratio of the first encoded data based on a volume of the preliminary data and a volume of the first encoded data. For example, the compression ratio of the first encoded data is determined by calculating the ratio of the volume of the preliminary data to the volume of the first encoded data.

The compression threshold may be set by a user, according to default settings of the data processing system 100, etc. For example, the compression threshold may be set by a user as 1.5, 2, 3, 4, 5, etc., according to actual needs (e.g., data transmission). If the compression ratio of the first encoded data is below the compression threshold, it may indicate that a degree of compression of the first encoded data is not satisfying, and the process may proceed to 540. If the compression ratio of the first encoded data exceeds the compression threshold, it may indicate that a degree of compression of the first encoded data is satisfying, and the process may terminate and the first encoded data, as a lossless compression result of the preliminary data or the original data, may be stored, e.g., into the storage device, or transmitted, e.g., to the data allocating system 140.

In 540, the processing device 110 (e.g., the compression module 420, the processor 210) may generate second encoded data by compressing the preliminary data in a second encoding procedure.

The second encoding procedure may be a lossless compression procedure. In some embodiments, the second encoding procedure may relate to an encoding length of the preliminary data. The preliminary data provided herein and hereafter in FIGS. 8 and 9 may include, for example, each difference value of the difference sequence of the preliminary data). Merely by way of example, in the second encoding procedure, an encoding length of the preliminary data may be determined based on a value of the preliminary data. Intermediate encoded data may be generated by compressing the preliminary data based on the encoding length. The second encoded data may be generated based on the intermediate encoded data and the encoding length. By compressing the preliminary data in the first encoding procedure or the second encoding procedure, a volume of the preliminary data may be reduced effectively without losing data fidelity. Thus, the compressed data (e.g., the second encoded data) may be transmitted in a limited (e.g., relatively narrow) bandwidth. Details regarding the generation of the second encoded data may be found elsewhere in the present disclosure, for example, FIGS. 8 and 9 and the descriptions thereof.

According to the embodiments set forth above, the preliminary data including the difference sequence may be obtained. In comparison with the original data (e.g., in the form of the data stream), the difference sequence may have a relatively small data fluctuation. The preliminary data may be compressed in a lossless manner in the first encoding procedure at first. The first encoding procedure may relate to the shortest coding parameter corresponding to the preliminary data. The effectivity and efficiency of the first encoding procedure may depend on the continuity of the preliminary data. If the compression ratio of the first encoded data is below the threshold, it may indicate that the degree of compression of the first encoded data is not satisfying. The preliminary data may be re-compressed in a lossless manner in the second encoding procedure. The second encoding procedure may relate to an encoding length of the preliminary data. The second encoding procedure may be less sensitive to the continuity of the preliminary data. In this case, the second encoding procedure may serve as a complimentary for the first encoding procedure. By compressing the preliminary data in the first encoding procedure and/or the second encoding procedure, a volume of the preliminary data may be reduced effectively without losing data fidelity.

It should be noted that the above description of the process 500 is provided for the purposes of illustration, not intended to limit the scope of the present disclosure. For persons having ordinary skills in the art, multiple variations and modifications may be reduced to practice in the light of the present disclosure. For example, the second encoded data may be generated by compressing the first encoded data in a second encoding procedure. In this way, a compression ratio of the second encoded data may be higher. However, these variations and modifications fall in the scope of the present disclosure.

Figure 6:
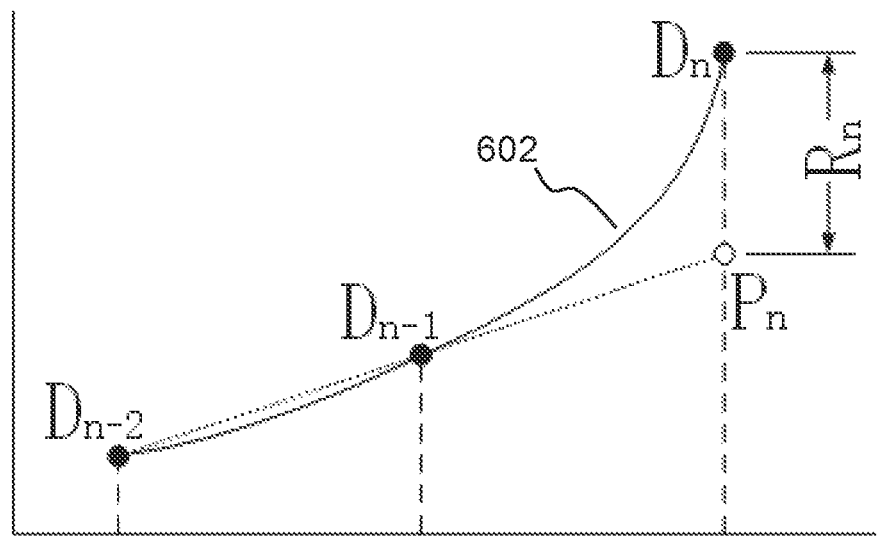
FIG. 6 is a schematic diagram illustrating a linear prediction according to some embodiments of the present disclosure.

FIG. 6 is a schematic diagram illustrating a linear prediction according to some embodiments of the present disclosure.

As illustrated in FIG. 6, a portion of a data stream may be in the form of a curve 602. The data stream may include a sequence of data points. $D_n$ represents a current data point (e.g., the n-th data point in the data stream), $D_{n-1}$ represents a first former data point of the current data point (e.g., the (n−1)-th data point in the data stream), and $D_{n-2}$ represents a second former data point of the current data point (e.g., the (n−2)-th data point in the data stream). A predicted data point $P_n$ corresponding to the current data point $D_n$ may be determined according to, for example, a linear prediction algorithm. The predicted data point $P_n$ may be determined as $P_n = 2 \times D_{n-1} - D_{n-2}$. The predicted data point $P_n$ may be on a straight line passing through the first former data point $D_{n-1}$ and the second former data point $D_{n-2}$. A difference value corresponding to the current data point may be $R_n = D_n - P_n$, where $R_n$ denotes the difference value.

In practical applications, $P_n$ may be obtained by performing a bit operation. The bit operation may also be referred to as bit manipulation. For example, $P_n$ may be determined by shifting $D_{n-1}$ leftwards over 1 bit, and subtracting $D_{n-2}$. In this way, a multiplication operation may be omitted, thus speeding up the linear prediction process. In comparison with a non-linear prediction algorithm, the linear prediction algorithm may have a better applicability and less computation load.

Figure 7:
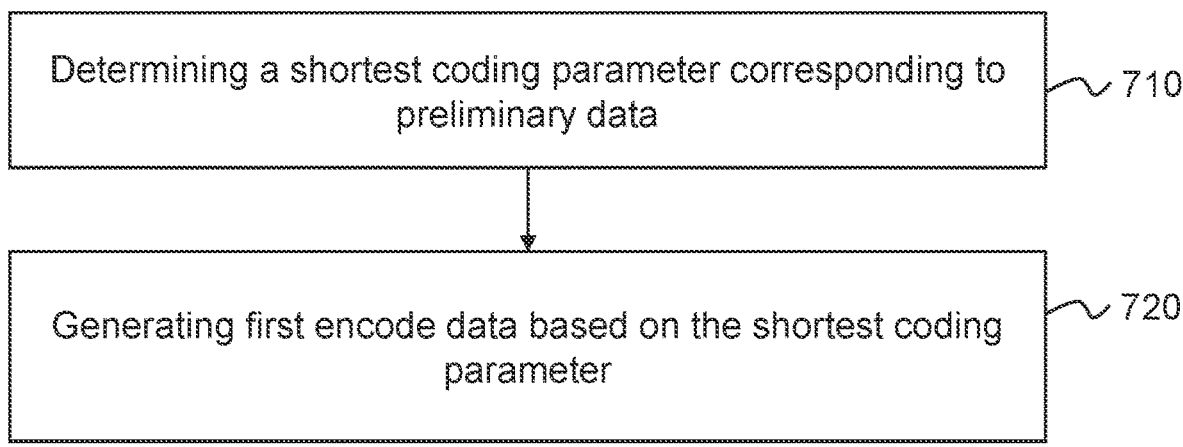
FIG. 7 is a flowchart illustrating an exemplary process for generating first encoded data according to some embodiments of the present disclosure.

FIG. 7 is a flowchart illustrating an exemplary process for generating first encoded data according to some embodiments of the present disclosure. In some embodiments, the process 700 may be implemented in the data processing system 100. For example, the process 700 may be stored in the storage 120 and/or the storage (e.g., a ROM, a RAM, etc.) as a form of instructions, and invoked and/or executed by the processing device 110 (e.g., the processor 210).

In 710, the processing device 110 (e.g., the compression module 420, the processor 210) may determine a shortest coding parameter corresponding to the preliminary data.

The shortest coding parameter may be a parameter indicating a minimum number (or count) of bits for storing the preliminary data. In some embodiments, the shortest coding parameter may be set by a user, according to default settings of the data processing system 100, etc. For example, the shortest coding parameter may be set as a constant. The shortest coding parameter may be used in one or more first encoding procedures for compressing different preliminary data. However, the shortest coding parameter, as a constant, may only be applicable in the compression of preliminary data with a relatively small data fluctuation.

In some embodiments, the shortest coding parameter may be determined based on the preliminary data (e.g., the difference sequence or difference sub-sequences of the plurality of data blocks). In some embodiments, a shortest coding parameter for a data block in the data stream may be determined according to Equation (1):

$$m = \lfloor \log_e 2 \times \log_2(\overline{|R[..]|}) \rfloor, \quad (1)$$

where m denotes the shortest coding parameter, R denotes a difference sub-sequence of the data block, $|\overline{R[..]}|$ denotes a mean absolute value of the difference sub-sequence, and $\log_e 2$ may be a constant. $\log_2 x$ may be equivalent to a number (or count) of times that x becomes 0 after multiple arithmetic right shifts are performed, i.e., a number (or count) of bits that x occupies (an arithmetic right shift may represent 1 bit).

According to Equation (1), the shortest coding parameter may be determined by multiplying the number (or count) of bits that the mean absolute value of the difference sub-sequence occupies by $\log_e 2$, and rounding down the product of the number (or count) of bits that the mean absolute value of the difference sub-sequence occupies and $\log_e 2$. The shortest coding parameter may be applicable in the compression of preliminary data with a relatively large or unknown data fluctuation.

It should be noted that the determination of the shortest coding parameter is illustrated in combination with the difference sub-sequence of the data block for illustration purposes. In practical applications, the shortest coding parameter may also be determined with respect to data points in the data stream. At this time, |R[..]| may denote a mean absolute value of the data points. In some embodiments, the determination of the shortest coding parameter may also be implemented by performing a bit operation, which reduces a computation load of the processing device 110 (e.g., the processor 210).

In 720, the processing device 110 (e.g., the compression module 420, the processor 210) may generate the first encode data based on the shortest coding parameter.

The processing device 110 may encode the preliminary data according to the shortest coding parameter. In some embodiments, as for each of the difference values constituting the difference sequence, the difference value may be represented using a combination of a sign, an arithmetic compliment of an absolute value of the difference value divided by $2^m$, and an arithmetic quotient of the absolute value of the difference value divided by $2^m$. The sign may indicate whether the difference value is positive or negative.

In some embodiments, the arithmetic compliment and the arithmetic quotient may be determined by performing bit operations. An absolute value of a current difference value may be represented by r. A corresponding arithmetic compliment may be determined based on a bitwise-AND of r and $2^m-1$. $2^m$ may be determined based on m left shifts of 1. The corresponding arithmetic quotient may be determined based on m right shifts of r.

The processing device 110 may generated the first encoded data based on the sign, the arithmetic compliment, and the arithmetic quotient of each of the difference values. The first encoded data may include four parts or components including, for example, an encoding sign, an encoding arithmetic compliment, an encoding arithmetic quotient, an ending mark as shown in table 1. Merely for illustration, the encoding sign may indicate whether the first encoded data is positive or negative. The encoding sign may have a length of 1 bit, 0 may indicate that first encoded data is positive, and 1 may indicate that first encoded data is negative. The encoding arithmetic compliment may have a length of m bits. A big-end/small-end of the encoding arithmetic compliment may be encoded using a binary encoding algorithm. The encoding arithmetic quotient may have a length of larger than or equal to 0. The encoding arithmetic quotient may include a plurality of 0. A number (or count) of the plurality of 0 may equal a value of the encoding arithmetic quotient. The ending mark may be used to mark an ending of the first encoded data, and have a constant value of 1. Examples of first encoded data (m=4) may be shown in table 2.

TABLE 1

Components of the first encoded data

| Component | Length (bit) | Description |
|---|---|---|
| Encoding sign | 1 | 0: positive, 1: negative |
| Encoding arithmetic compliment | m | A big-end/small-end of the encoding arithmetic compliment may be encoded using a binary encoding algorithm |

TABLE 1-continued

Components of the first encoded data

| Component | Length (bit) | Description |
|---|---|---|
| Encoding arithmetic quotient | ≥0 | Composed of a plurality of 0. A number (or count) of the plurality of 0 may equal a value of the encoding arithmetic quotient |
| Ending mark | 1 | As a constant 1 |

TABLE 2

Exemplary first encoded data

| Current difference value | Encoding sign | Encoding arithmetic compliment | Encoding arithmetic quotient | First encoded data |
|---|---|---|---|---|
| 0 | 0 | 0 | 0 | 0 0000 1 |
| 7 | 0 | 7 | 0 | 0 0111 1 |
| −17 | 1 | 1 | 1 | 1 0001 01 |
| 110 | 0 | 14 | 6 | 0 1110 000000 1 |

Figure 8:
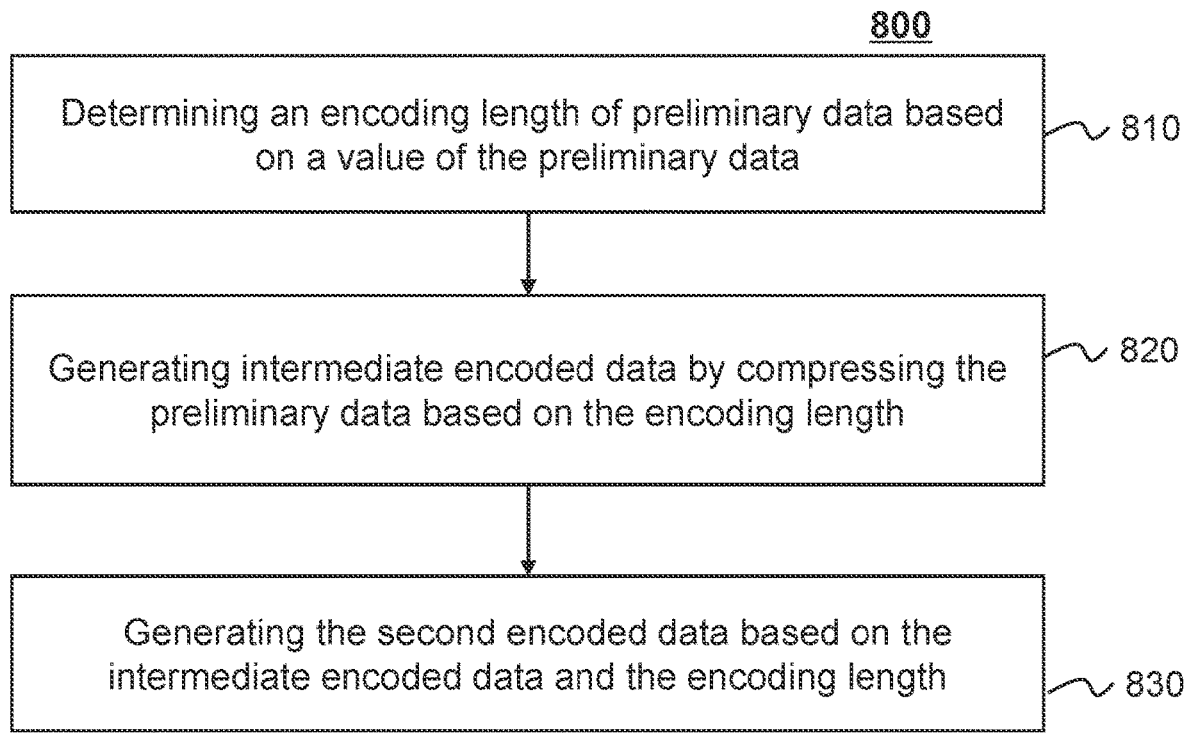
FIG. 8 is a flowchart illustrating an exemplary process for generating second encoded data according to some embodiments of the present disclosure.

FIG. 8 is a flowchart illustrating an exemplary process for generating second encoded data according to some embodiments of the present disclosure. In some embodiments, the process 800 may be implemented in the data processing system 100. For example, the process 800 may be stored in the storage 120 and/or the storage (e.g., a ROM, a RAM, etc.) as a form of instructions, and invoked and/or executed by the processing device 110 (e.g., the processor 210).

In 810, the processing device 110 (e.g., the compression module 420, the processor 210) may determine an encoding length of the preliminary data based on a value of the preliminary data.

The value of the preliminary data refers to a numerical value of the preliminary data. The preliminary data provided herein and hereafter in FIGS. 8 and 9 may include, for example, each difference value of the difference sequence of the preliminary data). For example, the preliminary data includes a number 72, and the value may be 72.

The encoding length may be a minimum number (or count) of bytes for storing the preliminary data. In conventional ways, the preliminary data may be stored in N bytes. N may be a constant, such as 1, 2, 4, etc. For example, N=4 and the preliminary data includes 72, an encoding result of a binary encoding of the preliminary data may be 00000000 00000000 00000000 01001000. As another example, N=4 and the preliminary data includes 0, an encoding result of the binary encoding of the preliminary data may be 00000000 00000000 00000000 00000000. In such a case, the encoding result may include a plurality of invalid numbers of 0, which may occupy excessive storage space. Referring to the example N=4 and the preliminary data includes 72, the effective number (or count) of bits of the encoding result is 8. Thus, the encoding length of the preliminary data may need be determined so as to generate an encoding result (e.g., the second encoded data) which has a smaller data volume and occupies less storage device.

The processing device 110 may determine the encoding length of the preliminary data based on the value of the preliminary data. In some embodiments, a correspondence relationship between candidate lengths and candidate value ranges may be obtained. The processing device 110 may determine the encoding length of the preliminary data according to the correspondence relationship and the value of the preliminary data.

In 820, the processing device 110 (e.g., the compression module 420, the processor 210) may generate intermediate encoded data by compressing the preliminary data based on the encoding length.

The intermediate encoded data may be intermediate data corresponding to the preliminary data generated in the second encoding procedure. The intermediate encoded data may be generated based on the encoding length using different approaches. In some embodiments, the processing device 110 may generate the intermediate encoded data by moving bytes of the preliminary data leftwards according to the encoding length. For example, the preliminary data may be moved towards an upper byte at a step of the encoding length, the lower byte may be filled with 0. Alternatively, the processing device 110 may identify one or more invalid bytes in the preliminary data based on the encoding length. The intermediate encoded data may be generated by removing the one or more invalid bytes from the preliminary data. As used herein, an invalid byte may be a byte of the preliminary data that does not play an essential role in representing the preliminary data. Referring back to the above example, two upper bytes of the encoding result are invalid bytes, when N=4 and the preliminary data includes 72. It should be noted that the approaches exemplified above are merely for illustration purposes, and not intended to be limiting. Any other suitable approaches may also be used to generate the intermediate encoded data.

In some embodiments, the generation of the intermediate encoded data may be implemented by performing a bit operation, which may improve the efficiency of the data compression process, and reduce a computation load of the processing device 110 (e.g., the processor 210).

In 830, the processing device 110 (e.g., the compression module 420, the processor 210) may generate the second encoded data based on the intermediate encoded data and the encoding length.

The second encoded data may be determined by compressing the preliminary data in the second procedure. The second procedure may relate to the encoding length and the intermediate encoded data. The second encoded data may be generated based on the intermediate encoded data and the encoding length using different approaches. In some embodiments, the processing device 110 may generate length encoded data by encoding the encoding length. The second encoded data may be generated by inserting the length encoded data into one or more bit positions within the intermediate encoded data.

The length encoded data may be encoded data relating to the encoding length. In some embodiments, the length encoded data may be an encoding result of the encoding length. The length encoded data may be determined by encoding the encoding length in an encoding procedure. Merely for illustration, an encoding length of 1 byte may be encoded as 00, an encoding length of 2 bytes may be encoded as 01, an encoding length of 3 bytes may be encoded as 10, and an encoding length of 4 bytes may be encoded as 11. The one or more bit positions may be defined by a user, according to default settings of the data processing system 100, etc. In some embodiments, the one or more bit positions may be determined by selecting at least one bit from the intermediate encoded data. For example, the one or more bit positions may be determined as L upper bits of the intermediate encoded data. L may be an integer larger than or equal to 1. The value of L may relate to, e.g., the encoding length. Illustratively, the intermediate encoded data may include two bytes including an upper byte and a lower byte. Positions of two lower bits in the upper byte of the intermediate encoded data may be determined as the one or more bit positions.

Alternatively, the processing device 110 may generate length encoded data by encoding the encoding length. The second encoded data may be generated by splicing the length encoded data and the intermediate encoded data. For example, the length encoded data may be spliced at an upper end or a lower end of the code of the intermediate encoded data directly. It should be noted that the approaches exemplified above are merely for illustration purposes, and not intended to be limiting. Any other suitable approaches may also be used to generate the second encoded data. Examples of second encoded data may be shown in table 3.

TABLE 3

Exemplary second encoded data

| Preliminary data | Encoding length (byte) | Second encoded data |
|---|---|---|
| −17 | 1 | 00 101111 |
| 72 | 2 | 01 000000 01001000 |
| 1765937 | 3 | 10 011010 11110010 00110001 |
| −478767369 | 4 | 11 100011 01110110 10010110 11110111 |

According to the embodiments set forth above, the second encoded data may be generated in a lossless compression by moving bytes of the preliminary data leftwards according to the encoding length or removing one or more invalid bytes from the preliminary data. The second encoded data may occupy less storage space (e.g., number (or count) of bytes for storing the second encoded data). Besides, an accuracy of decompression of the second encoded data via the encoding length may be relatively high. In some embodiments, a stream-oriented computation may be applied during the second compression procedure. In combination with the bit operation performed to determine the intermediate encoded data, the efficiency of the second encoding procedure may be improved, and the computation load of the processing device 110 (e.g., the processor 210) may be reduced. In a practical application for compressing electroencephalography (EEG) data in the second encoding procedure, a data volume of encoded EEG data may reach 24~26% of an original data volume of the EEG data after the compression process is complete (i.e., the compression ratio of the second encoding procedure is relatively high).

Figure 9:
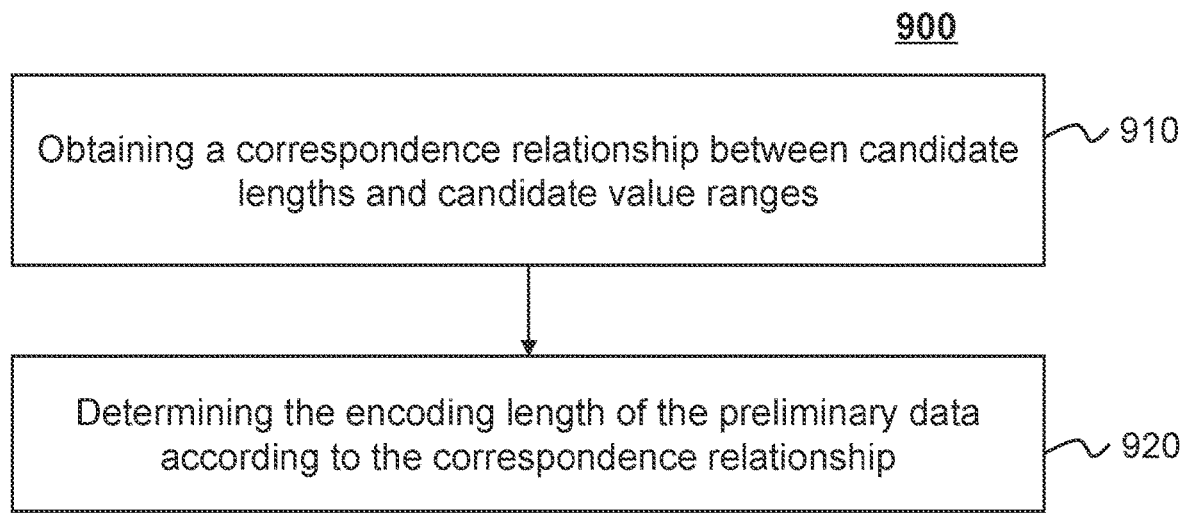
FIG. 9 is a flowchart illustrating an exemplary process for generating second encoded data according to some embodiments of the present disclosure.

FIG. 9 is a flowchart illustrating an exemplary process for generating second encoded data according to some embodiments of the present disclosure. In some embodiments, the process 800 may be implemented in the data processing system 100. For example, the process 800 may be stored in the storage 120 and/or the storage (e.g., a ROM, a RAM, etc.) as a form of instructions, and invoked and/or executed by the processing device 110 (e.g., the processor 210).

In 910, the processing device 110 (e.g., the compression module 420, the processor 210) may obtain a correspondence relationship between candidate lengths and candidate value ranges.

In some embodiments, a candidate value range may be determined according to an effective number (or count) of bits of a candidate length. The candidate length may correspond to the candidate value range according to the correspondence relationship. As used herein, the candidate length refers to an encoding length of candidate data (e.g., candidate preliminary data). The candidate value range refers to a range of values stored in the effective number (or count) of bits. The effective number (or count) of bits refers to a number (or count) of bits for storing an encoding result of the candidate data. In some embodiments, the effective number (or count) of bits may equal a difference between a number (or count) of bits that the candidate length (in a unit of byte) includes and a number (or count) of bits that an encoding result of the candidate length occupies.

Merely by way of example, assuming that a candidate length occupies 2 bits, an effective number (or count) of bits for 1 byte may be 6 (i.e., 8−2), and a candidate value range may be [−32, 31] correspondingly; an effective number (or count) of bits for 2 bytes may be 14 (i.e., 16−2), and a candidate value range may be [−8192, 8919] correspondingly. An exemplary correspondence relationship between candidate lengths and candidate value ranges may be shown in table 4. As for table 4, a maximum value corresponding to a candidate length may be an upper limit of a candidate value range corresponding to the candidate length, and a minimum value corresponding to the candidate length may be a lower limit of the candidate value range corresponding to the candidate length.

TABLE 4

Correspondence relationship between candidate lengths and candidate value ranges

| Candidate length (byte) | Effective number of bits (bit) | Maximum value | Minimum value |
|---|---|---|---|
| 1 | 6 | −32 | 31 |
| 2 | 14 | −8192 | 8191 |
| 3 | 22 | −2097152 | 2097151 |
| 4 | 30 | −536870912 | 536870911 |

In 920, the processing device 110 (e.g., the compression module 420, the processor 210) may determine the encoding length of the preliminary data according to the correspondence relationship.

After the correspondence relationship between candidate lengths and candidate value ranges is obtained, the processing device 110 may identify one or more candidate value ranges. The value of the preliminary data may be within the one or more candidate value ranges. In some embodiments, the processing device 110 select a minimum candidate value range from the one or more candidate value ranges.

Merely for illustration, referring to table 4, a value 72 in the preliminary data may be within three candidate value ranges including [−8192, 8191], [−2097152, 20197151], and [−536870912, 536870911]. The processing device 110 select a minimum candidate value range [−8192, 8191] from the three candidate value ranges. Then the processing device 110 may determine a candidate length corresponding to the minimum candidate value range according to the correspondence relationship. The candidate length may be designated as the encoding length of the preliminary data.

Alternatively, the processing device 110 select a candidate value range with a maximum lower limit from the one or more candidate value ranges. Referring to the above example, the value 72 in the preliminary data may be within three candidate value ranges including [−8192, 8191], [−2097152, 20197151], and [−536870912, 536870911]. A maximum lower limit −8192 may be identified, and a candidate value range [−8192, 8191] with the maximum lower limit may be selected from the three candidate value ranges. Then a candidate length corresponding to the candidate value range may be designated as the encoding length of the preliminary data.

Figure 10:
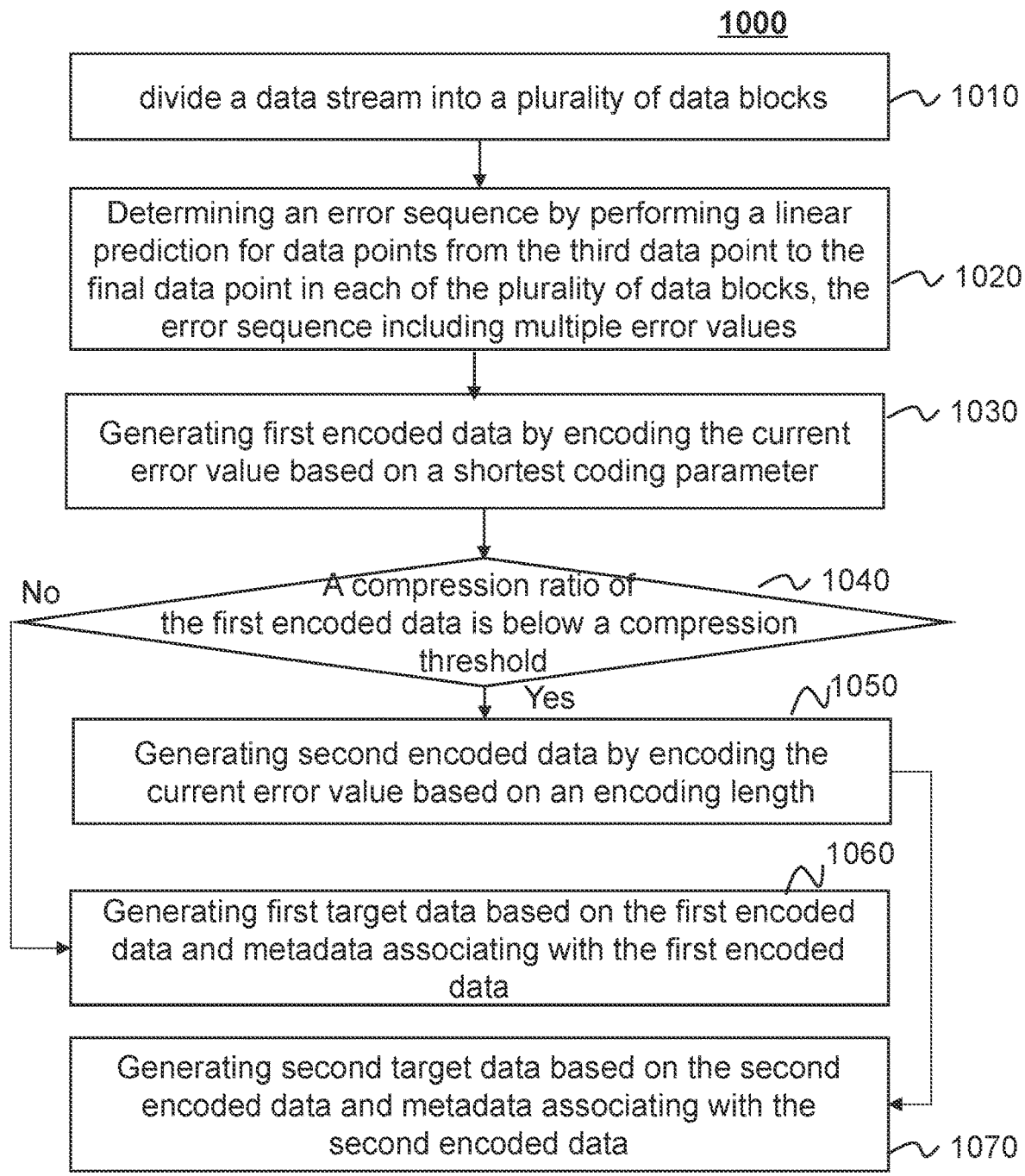
FIG. 10 is a flowchart illustrating an exemplary process for lossless data compression according to some embodiments of the present disclosure.

FIG. 10 is a flowchart illustrating an exemplary process for lossless data compression according to some embodiments of the present disclosure. In some embodiments, the process 1000 may be implemented in the data processing system 100. For example, the process 1000 may be stored in the storage 120 and/or the storage (e.g., a ROM, a RAM, etc.) as a form of instructions, and invoked and/or executed by the processing device 110 (e.g., the processor 210).

In 1010, the processing device 110 (e.g., the obtaining module 410, the processor 210) may divide a data stream into a plurality of data blocks. In some embodiments, the operation in 1010 may be similar to or the same as 510 of the process 500 as illustrated in FIG. 5, which is not repeated here.

In 1020, the processing device 110 (e.g., the obtaining module 410, the processor 210) may determine a difference sequence by performing a linear prediction for data points from the third data point to the final data point in each of the plurality of data blocks, the difference sequence including multiple difference values. In some embodiments, the operation in 1020 may be similar to or the same as 510 of the process 500 as illustrated in FIG. 5, which is not repeated here.

In 1030, the processing device 110 (e.g., the compression module 420, the processor 210) may generate first encoded data by encoding the current difference value based on a shortest coding parameter. In some embodiments, the operation in 1030 may be similar to or the same as operations 710 and 720 of the process 700 as illustrated in FIG. 7, which is not repeated here.

In 1040, the processing device 110 (e.g., the determination module 430, the processor 210) may determine whether a compression ratio of the first encoded data is below a compression threshold.

If it is determined that the compression ratio of the first encoded data is below a compression threshold, the process may proceed to 1050. If it is determined that the compression ratio of the first encoded data exceeds the compression threshold, the process may proceed to 1060.

In 1050, the processing device 110 (e.g., the compression module 420, the processor 210) may generate second encoded data by encoding the current difference value based on an encoding length.

In some embodiments, the operation in 1050 may be similar to or the same as operations 810 through 920 of the process 900 as illustrated in FIG. 9, which is not repeated here. After the second encoded data is generated, the process may proceed to 1070.

In 1060, the processing device 110 (e.g., the compression module 420, the processor 210) may generate first target data based on the first encoded data and metadata associating with the first encoded data.

The metadata may also be referred to as intermediary data, relay data, etc. The metadata may be data about data (e.g., the first encoded data, the second encoded data). The metadata may describe property information of the data (e.g., the first encoded data, the second encoded data). The metadata may include descriptive metadata, structural metadata, reference metadata, statistical metadata, etc. In some embodiments, the metadata may facilitate a storage position indication, historical data retrieval, resource retrieval, file recording, etc. The data about the first encoded data may also be referred to as metadata associating with the first encoded data or first metadata. The data about the second encoded data may also be referred to as metadata associating with the second encoded data or second metadata.

In some embodiments, the metadata may include four parts or components including, for example, a signal identification (ID), a compression mode, a load length, and load data as shown in table 5. The signal ID may be used to distinct multiple data streams. The signal ID may have a length of 1 byte. The compression mode may indicate whether a compression is performed or not and/or a compression procedure used in the compression. For example, the compression mode may be represented by 2 lower bits. 00 may indicate that the compression is not performed; 01 may indicate a compression procedure that is based on an encoding length; 10 may indicate a compression procedure that is based on a shortest coding parameter; and 11 may be reserved. In addition, the remaining 6 upper bits in the byte may store a value of the shortest coding parameter for the compression mode 10. The remaining 6 upper bits in the byte may store a number (or count) of bytes that a value occupies (e.g., a value of 24 bits occupies 3 bytes, a value of 16 or 12 bits occupies 2 bytes, a value of 8 bits occupies 1 byte) for the compression mode 00. The remaining 6 upper bits in the byte may be empty for the compression mode 01. The load length may be an encoding length of load data (e.g., the first encoded data or the second encoded data). The load length may have a length of 1-4 bytes. The load data may be data stored in the metadata. If there is no compression is performed, original data (e.g., a data stream or a portion thereof) in a big-end/small-end format may be stored. As for the compression procedure that is based on the encoding length, the first and second data points encoded based on the encoding length may be stored at first, and the difference sequence encoded based on the encoding length may be stored subsequently. As for the compression procedure that is based on the shortest coding parameter, the first and second data points encoded based on the shortest coding parameter may be stored at first, and the difference sequence encoded based on the shortest coding parameter may be stored subsequently.

TABLE 5

Components of meta data

| Components | Length (byte) | Description |
|---|---|---|
| Signal ID | 1 | Distinct multiple data streams |
| Compression mode | 1 | Two lower bits represent whether a compression is performed or not and/or a compression procedure for the compression: 00: compression is not performed, 01: encoding length based compression, 10: shortest coding parameter based compression, 11: reserved 10: the remaining 6 upper bits in the byte may store a value of the shortest coding parameter; 00: the remaining 6 upper bits in the byte may store a number (or count) of bytes that a value occupies (e.g., a value of 24 bits occupies 3 bytes, a value of 16 or 12 bits occupies 2 bytes, a value of 8 bits occupies 1 byte); 01: the remaining 6 upper bits in the byte may be empty |
| Load length | 1~4 | An encoding length of load data |
| Load data | >0 | Storing data: 00: storing original data (e.g., a data stream or a portion thereof) in a big-end/small-end format 01: storing the first and second data points encoded based on the encoding length at first, then storing the difference sequence encoded based on the encoding length |

TABLE 5-continued

Components of meta data

| Components | Length (byte) | Description |
|---|---|---|
| | | 10: storing the first and second data points encoded based on the shortest coding parameter at first, then storing the difference sequence encoded based on the shortest coding parameter |

If the compression ratio of the first encoded data exceeds the compression threshold, the processing device 110 may generate the first target data based on the first encoded data and metadata associating with the first encoded data. The first target data may be generated by splicing the first encoded data and metadata associating with the first encoded data.

In 1070, the processing device 110 (e.g., the compression module 420, the processor 210) may generate second target data based on the second encoded data and metadata associating with the second encoded data.

In some embodiments, the processing device 110 may further determine whether a compression ratio of the second encoded data is below the compression threshold. If it is determined that the compression ratio of the second encoded data exceeds the compression threshold, the processing device 110 may generate the second target data based on the second encoded data and metadata associating with the second encoded data. The second target data may be generated by splicing the second encoded data and metadata associating with the second encoded data. If it is determined that the compression ratio of the second encoded data is below the compression threshold, the process may terminate. The preliminary data may be output directly without compression.

FIG. 11 is a flowchart illustrating an exemplary process for data decompression according to some embodiments of the present disclosure. In some embodiments, the process 1100 may be implemented in the data processing system 100. For example, the process 1100 may be stored in the storage 120 and/or the storage (e.g., a ROM, a RAM, etc.) as a form of instructions, and invoked and/or executed by the processing device 110 (e.g., the processor 210).

In 1110, the processing device 110 (e.g., the decompression module 440, the processor 210) may obtain an encoded data stream and metadata from the encoded data stream.

The encoded data stream may be a data stream that includes target data (e.g., the first target data or the second target data) generated according to the embodiments as described in FIG. 10. The first target data may be generated by splicing the first encoded data and first metadata. The second target data may be generated by splicing the second encoded data and second metadata. The metadata may include, for example, the compression mode, the load length, and the load data regarding the target data (e.g., the first target data or the second target data).

In 1120, the processing device 110 (e.g., the decompression module 440, the processor 210) may determine preliminary data corresponding to the encoded data stream based on the metadata.

As for first metadata, the processing device 110 may retrieve the first encoded data from the encoded data stream. The processing device 110 may obtain a shortest coding parameter corresponding to the first encoded data. The preliminary data may be determined by decoding the first encoded data based on the shortest coding parameter.

As for second metadata, the processing device 110 may retrieve the second encoded data from the encoded data stream. The processing device 110 may obtain an encoding length corresponding to the second encoded data. The preliminary data may be determined by decoding the second encoded data based on the encoding length. A decoding procedure may be an inverse operation of the encoding procedure, which is not described here.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

What is claimed is:

1. A system, comprising:
   at least one storage medium including a set of instructions; and
   at least one processor configured to communicate with the at least one storage medium, wherein when executing the set of instructions, the at least one processor is configured to direct the system to perform operations including:
   obtaining preliminary data;
   generating first encoded data by compressing the preliminary data in a first encoding procedure;
   determining whether a compression ratio of the first encoded data is below a compression threshold; and
   in response to determining that the compression ratio of the first encoded data is below the compression threshold,
   generating second encoded data by compressing the preliminary data in a second encoding procedure, wherein the first encoding procedure and the second encoding procedure are lossless compressions.

2. The system of claim 1, wherein obtaining the preliminary data includes:
obtaining a data stream;
dividing the data stream into a plurality of data blocks;
for each of the plurality of data blocks,
identifying a first former data point prior to a current data point and a second former data point prior to the first former data point, the data block including a sequence of n data points, the current data point being a data point selected from the third data point to the n-th data point;
determining a predicted data point corresponding to the current data point based on the first former data point and the second former data point; and
determining a difference value corresponding to the current data point based on the predicted data point and the current data point;
generating, according all the difference values, a difference sequence of the plurality of data blocks by traversing all the data points of the data blocks; and
including the difference sequence in the preliminary data.

3. The system of claim 1, wherein generating the first encoded data by compressing the preliminary data in the first encoding procedure includes:
determining a shortest coding parameter corresponding to the preliminary data; and
generating the first encode data based on the shortest coding parameter.

4. The system of claim 1, wherein generating the second encoded data by compressing the preliminary data in the second encoding procedure includes:
determining an encoding length of the preliminary data based on a value of the preliminary data;
generating intermediate encoded data by compressing the preliminary data based on the encoding length; and
generating the second encoded data based on the intermediate encoded data and the encoding length.

5. The system of claim 4, wherein generating the intermediate encoded data by compressing the preliminary data based on the encoding length includes:
generating the intermediate encoded data by moving bytes of the preliminary data leftwards according to the encoding length.

6. The system of claim 4, wherein generating the intermediate encoded data by compressing the preliminary data based on the encoding length includes:
identifying one or more invalid bytes in the preliminary data based on the encoding length; and
generating the intermediate encoded data by removing the one or more invalid bytes from the preliminary data.

7. The system of claim 4, wherein generating the second encoded data based on the intermediate encoded data and the encoding length includes:
generating length encoded data by encoding the encoding length; and
generating the second encoded data by inserting the length encoded data into one or more bit positions within the intermediate encoded data.

8. The system of claim 4, wherein generating the second encoded data based on the intermediate encoded data and the encoding length includes:
generating length encoded data by encoding the encoding length; and
generating the second encoded data by splicing the length encoded data and the intermediate encoded data.

9. The system of claim 1, the operations further including:
generating target data based on the second encoded data and metadata associating with the second encoded data.

10. The system of claim 1, the operations further including:
transmitting the second encoded data in a limited bandwidth.

11. The system of claim 1, wherein the first encoding procedure and the second encoding procedure are different encoding procedures.

12. A method of lossless compression implemented on a computing device having a processor and a computer-readable storage device, the method comprising:
obtaining preliminary data;
generating first encoded data by compressing the preliminary data in a first encoding procedure;
determining whether a compression ratio of the first encoded data is below a compression threshold; and
in response to determining that the compression ratio of the first encoded data is below the compression threshold,
generating second encoded data by compressing the preliminary data in a second encoding procedure, wherein the first encoding procedure and the second encoding procedure are lossless compressions.

13. The method of claim 12, wherein obtaining the preliminary data includes:
obtaining a data stream;
dividing the data stream into a plurality of data blocks;
for each of the plurality of data blocks,
identifying a first former data point prior to a current data point and a second former data point prior to the first former data point, the data block including a sequence of n data points, the current data point being a data point selected from the third data point to the n-th data point;
determining a predicted data point corresponding to the current data point based on the first former data point and the second former data point; and
determining a difference value corresponding to the current data point based on the predicted data point and the current data point;
generating, according all the difference values, a difference sequence of the plurality of data blocks by traversing all the data points of the data blocks; and
including the difference sequence in the preliminary data.

14. The method of claim 12, wherein generating the first encoded data by compressing the preliminary data in the first encoding procedure includes:
determining a shortest coding parameter corresponding to the preliminary data; and
generating the first encode data based on the shortest coding parameter.

15. The method of claim 12, wherein generating the second encoded data by compressing the preliminary data in the second encoding procedure includes:
determining an encoding length of the preliminary data based on a value of the preliminary data;
generating intermediate encoded data by compressing the preliminary data based on the encoding length; and
generating the second encoded data based on the intermediate encoded data and the encoding length.

16. The method of claim 15, wherein generating the intermediate encoded data by compressing the preliminary data based on the encoding length includes:
generating the intermediate encoded data by moving bytes of the preliminary data leftwards according to the encoding length.

17. The method of claim 15, wherein generating the intermediate encoded data by compressing the preliminary data based on the encoding length includes:
identifying one or more invalid bytes in the preliminary data based on the encoding length; and
generating the intermediate encoded data by removing the one or more invalid bytes from the preliminary data.

18. The method of claim 15, wherein generating the second encoded data based on the intermediate encoded data and the encoding length includes:
generating length encoded data by encoding the encoding length; and
generating the second encoded data by inserting the length encoded data into one or more bit positions within the intermediate encoded data or generating the second encoded data by splicing the length encoded data and the intermediate encoded data.

19. The method of claim 12, further including:
generating target data based on the second encoded data and metadata associating with the second encoded data.

20. A non-transitory readable medium, comprising at least one set of instructions, wherein when executed by at least one processor of a computing device, the at least one set of instructions directs the at least one processor to perform a method, the method comprising:
obtaining preliminary data;
generating first encoded data by compressing the preliminary data in a first encoding procedure;
determining whether a compression ratio of the first encoded data is below a compression threshold; and
in response to determining that the compression ratio of the first encoded data is below the compression threshold,
generating second encoded data by compressing the preliminary data in a second encoding procedure, wherein the first encoding procedure and the second encoding procedure are lossless compressions.

* * * * *